United States Patent
Chang et al.

(10) Patent No.: US 8,473,801 B2
(45) Date of Patent: Jun. 25, 2013

(54) METHOD FOR INCREASING EFFICIENCY OF TRANSFERRING PACKET OF ISOCHRONOUS TRANSFER TYPE AND DEVICE THEREOF

(75) Inventors: Tso-Hsuan Chang, Taipei County (TW); Ming-Hsu Hsu, Taipei (TW); Teng-Chuan Hsieh, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 713 days.

(21) Appl. No.: 12/750,666

(22) Filed: Mar. 30, 2010

(65) Prior Publication Data

US 2010/0293435 A1    Nov. 18, 2010

(30) Foreign Application Priority Data

May 15, 2009   (TW) ................................ 98116150 A

(51) Int. Cl.
*G06F 11/08* (2006.01)
*H04L 1/16* (2006.01)

(52) U.S. Cl.
USPC .......................................... 714/748; 714/807

(58) Field of Classification Search
USPC .......................................... 714/748, 749, 807
See application file for complete search history.

(56) References Cited

U.S. PATENT DOCUMENTS

| | | | | |
|---|---|---|---|---|
| 4,827,339 | A * | 5/1989 | Wada et al. ................ | 348/390.1 |
| 5,774,483 | A * | 6/1998 | Hwang ......................... | 714/815 |
| 6,593,937 | B2 * | 7/2003 | Ludtke et al. ................ | 345/629 |
| 6,717,947 | B1 * | 4/2004 | Ghodrat et al. ............ | 370/395.1 |
| 7,085,233 | B2 * | 8/2006 | Hayashino et al. ........... | 370/235 |
| 7,929,447 | B2 * | 4/2011 | Bardini et al. ................ | 370/236 |
| 8,041,856 | B2 * | 10/2011 | Raikar et al. .................... | 710/52 |
| 2001/0025239 | A1 | 9/2001 | Hakenberg | |
| 2003/0169687 | A1 | 9/2003 | Bardini | |
| 2006/0224936 | A1 | 10/2006 | Takamatsuya | |
| 2007/0239900 | A1 | 10/2007 | Beasley | |
| 2010/0198999 | A1 * | 8/2010 | Nair et al. ....................... | 710/33 |
| 2010/0287456 | A1 | 11/2010 | Chang | |

FOREIGN PATENT DOCUMENTS

| | | |
|---|---|---|
| CN | 101094206 A | 12/2007 |
| CN | 101887403 A | 11/2010 |

* cited by examiner

*Primary Examiner* — Stephen M Baker
(74) *Attorney, Agent, or Firm* — Winston Hsu; Scott Margo

(57) ABSTRACT

A method for increasing the efficiency of transferring packets of isochronous transfer type in USB 3.0 includes ignoring a packet of isochronous transfer type with an incorrect header. When the receiving end receives a packet of isochronous transfer type with an incorrect header, the receiving end does not send a retry signal to the transmitting end. Therefore, the transmitting end can more quickly transmit the following packets of isochronous transfer type.

27 Claims, 7 Drawing Sheets

METHOD FOR INCREASING EFFICIENCY OF TRANSFERRING PACKET OF ISOCHRONOUS TRANSFER TYPE AND DEVICE THEREOF

BACKGROUND OF THE INVENTION

1. Field of the Invention

The present invention relates to a method for data transferring, and more particularly, to a method for increasing efficiency of transferring packet of isochronous transfer type.

2. Description of the Prior Art

The Universal Serial Bus (USB) protocol version 3.0 defines four transfer types: control transfer type, interrupt transfer type, bulk transfer type, and isochronous transfer type. In general, isochronous transfer type is applied in audio and video transmissions. However, since the audio and the video transmission have to be real-time transferring, when packets of the isochronous transfer type are transferred, the transmission speed has to be stable without interruption, so as to prevent the audio or the video signals at the receiving end from discontinuous condition, or un-synchronization to the transmitting end.

Please refer to FIG. 1. FIG. 1 is a diagram illustrating the packet format of a USB 3.0 packet DP. USB 3.0 is taken as an example as shown in FIG. 1. The packet DP comprises a header H, and a data payload P. The header H comprises a type information TP, an end point information EP, a link command word LW, and a header error check code $CRC_H$. The data payload P comprises a data session D, and a data error check code $CRC_D$.

The type information TP is utilized for determining the packet type of the packet DP. The packet type, for example, may be handshake, data ... etc. The end point information EP is utilized for determining the transfer type of the packet DP, such as isochronous transfer type. The link command word LW is utilized for indicating the condition of the data connection, and the link command word LW further comprises a link command word error check code $CRC_L$ and a header sequence number HSEQ. The link command word error check code $CRC_L$ is utilized for determining if errors exist in the link command word LW. The head sequence number HSEQ is utilized for determining if the packet sequence of the packet DP is incorrect. The header error check code $CRC_H$ is utilized for determining if errors exist in the header H.

The data session D provides the actual transmitted data, such as audio data, video data ... etc. The data error check code $CRC_D$ is utilized for determining if errors exist in the data session D. Additionally, the data session D may comprise N data $SD_1 \sim SD_N$.

Please refer to FIG. 2. FIG. 2 is a diagram illustrating the packet of the isochronous transfer type being transferred by the prior art. As shown in FIG. 2, the transmitting end T may be a host or a device, and the receiving end may be a device or a host correspondingly. The data process of the transmitting end T and the receiving end R can be divided into the physical layer PH, the data link layer DL, and the protocol layer PR from the bottom. As shown in FIG. 2, when the receiving end R receives a packet $DP_1$ from the transmitting end T, after the process of the physical layer PH, the data link layer DL of the receiving end DL determines if the header $H_1$ of the packet $DP_1$ is correct directly according to the link command word error check code $CRC_{L1}$ and the header error check code $CRC_{H1}$. If the header $H_1$ of the packet $DP_1$ is determined to be correct, then the receiving end R executes the following process according to the header $H_1$ of the packet $DP_1$, and the following process may be uploading the packet $DP_1$ to the protocol layer PR of the receiving end R so as to determine if the data payload $P_1$ is correct according to the data error check code $CRC_{D1}$ of the data payload $P_1$ of the packet $DP_1$, and after the data payload $P_1$ of the packet $DP_1$ is determined to be correct, generating corresponding actions, e.g. outputting the audio or video data according to the protocol and the content of the data session $D_1$, according to the events defined by the protocol and the content of the data session $D_1$ (data $SD_{11} \sim SD_{1N}$). However, when the data link layer DL of the receiving end R determines the header $H_1$ of the packet $DP_1$ to be incorrect, the data link layer DL of the receiving end R directly sends a retry signal $S_{RETRY}$ to the transmitting end T for requiring the transmitting end T to transmit the packet $DP_1$ again. In other words, even the packet $DP_1$ is of the isochronous transfer type, the receiving end R still sends a retry signal $S_{RETRY}$ to the transmitting end T if the header of the packet $DP_1$ is incorrect. In this way, the transmitting end T has to transmit the packet $DP_1$ of the isochronous transfer type again. Therefore, when the audio or the video data are transmitted, unnecessary delay arises, which deteriorates the discontinuous condition or the un-synchronization, causing inconvenience.

SUMMARY OF THE INVENTION

The present invention provides a method for increasing efficiency of transferring packet of isochronous transfer type. The method comprises receiving a first packet of isochronous transfer type from a transmitting end; executing error code check on a header of the first packet of isochronous transfer type for obtaining a check result; and ignoring the first packet of isochronous transfer type when the check result represents incorrect.

The present invention further provides a method for increasing efficiency of transferring packet of isochronous transfer type. The method comprises when a transmitting end receives a retry signal corresponding to a first packet of isochronous transfer type from a receiving end, the transmitting end setting value of a second header sequence number of a second packet of isochronous transfer type according to value of a first header sequence number of the first packet of isochronous transfer type; and the transmitting end transmitting the second packet of isochronous transfer type with set second header sequence number to the receiving end.

The present invention further provides an apparatus for sending data on an isochronous communication protocol. The apparatus comprises a data link layer device selectively sending a cheating packet based on a detecting signal.

These and other objectives of the present invention will no doubt become obvious to those of ordinary skill in the art after reading the following detailed description of the preferred embodiment that is illustrated in the various figures and drawings.

DETAILED DESCRIPTION

Therefore, the present invention provides a novel transmitting method for improving the discontinuous condition and the un-synchronization for the isochronous transfer and further increasing the efficiency of transferring packet of isochronous transfer type.

Figure 1:
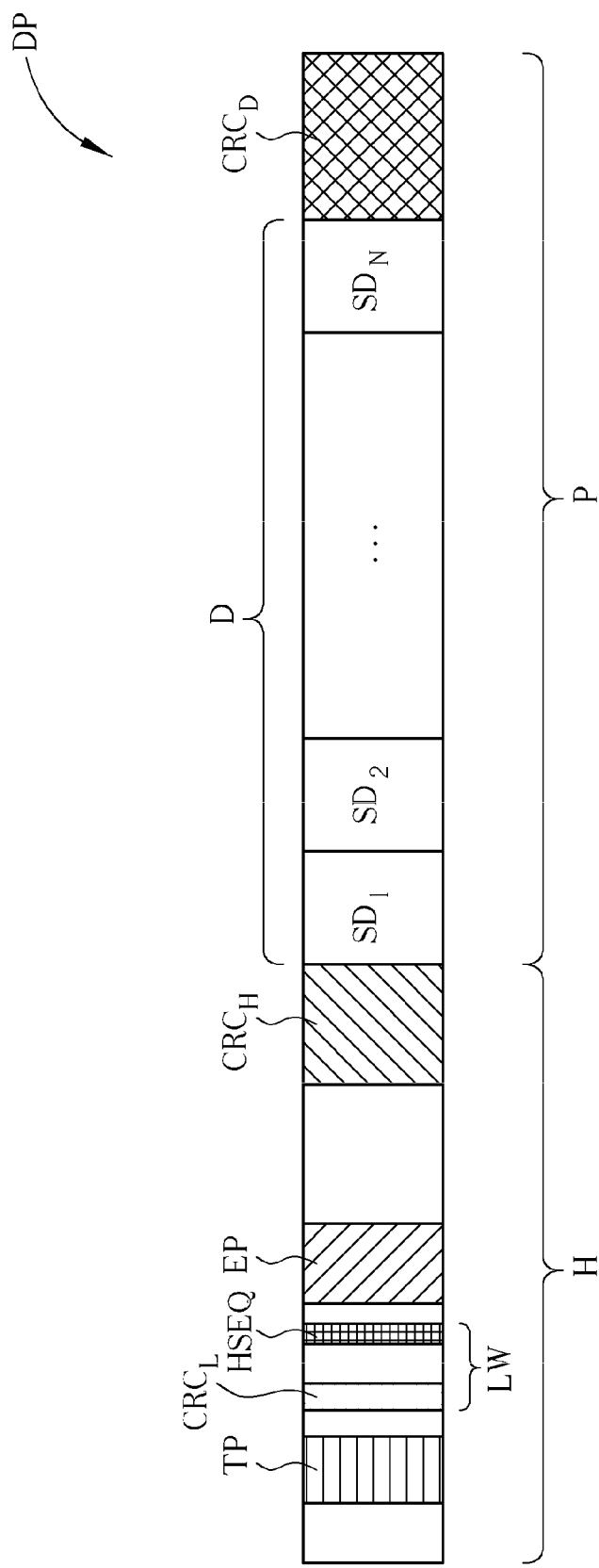
FIG. 1 is a diagram illustrating the packet format of a USB 3.0 packet DP.
Figure 2:
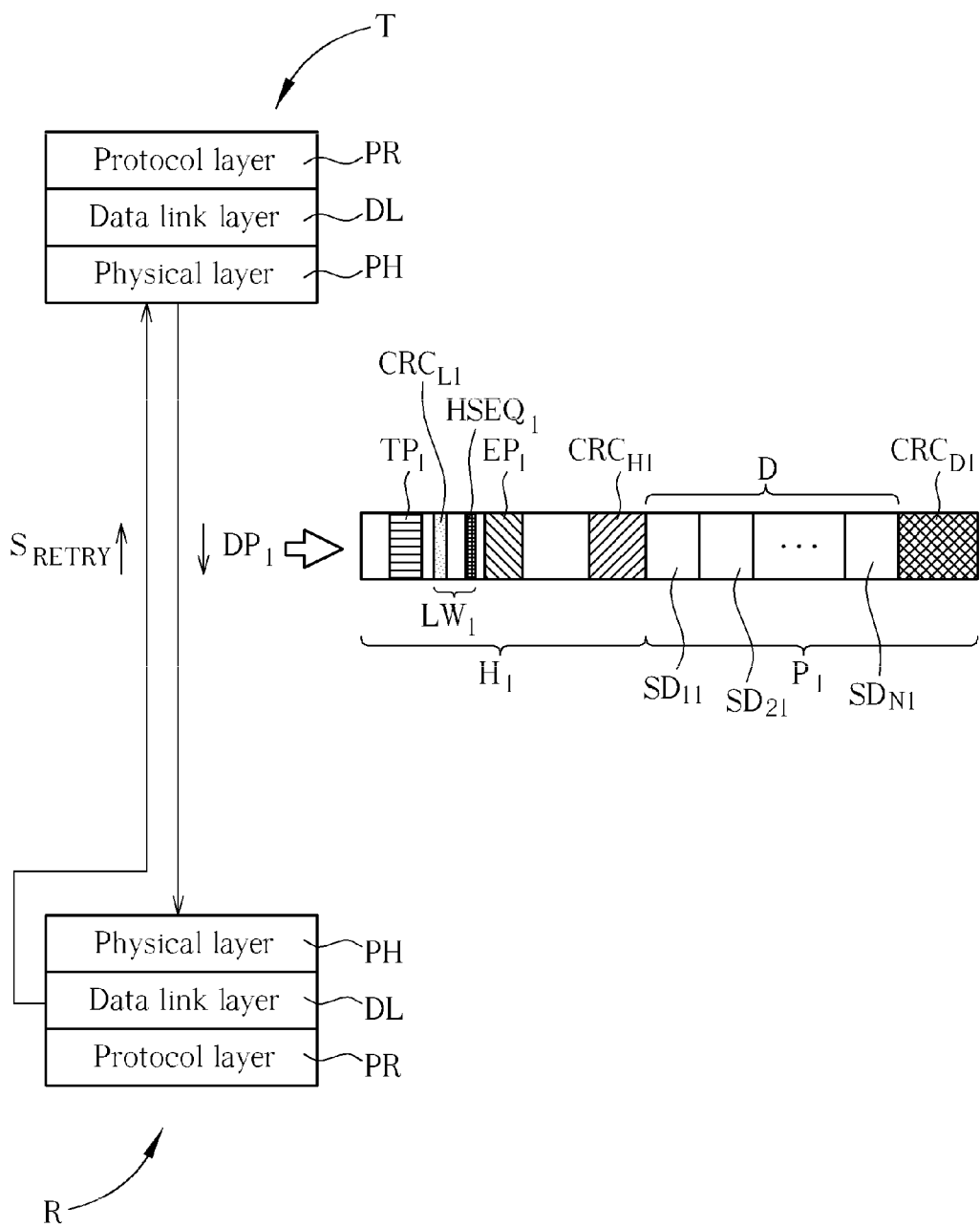
FIG. 2 is a diagram illustrating the packet of the isochronous transfer type being transferred by the prior art.
Figure 3:
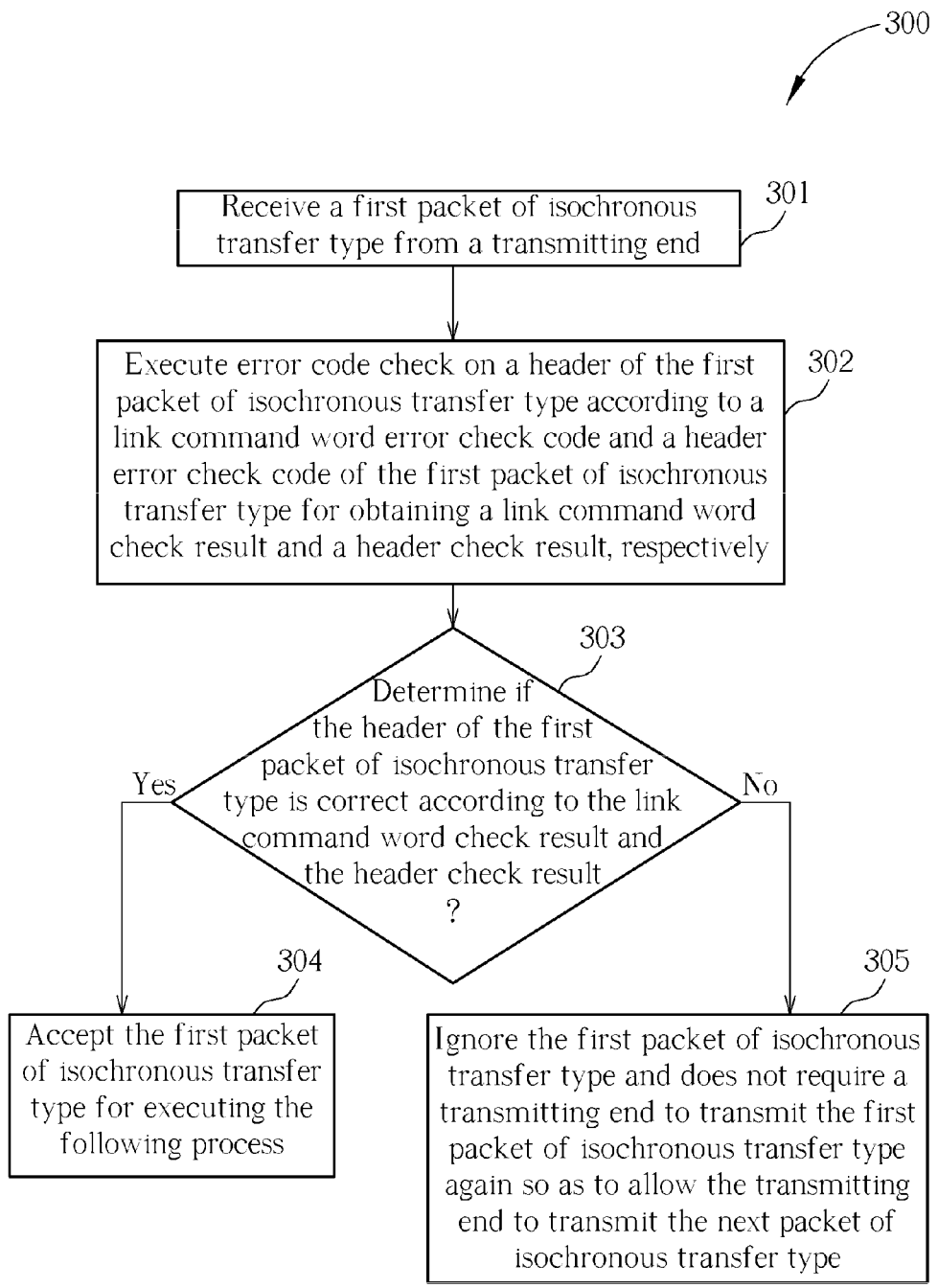
FIG. 3 is a flowchart illustrating a method for increasing the efficiency of transferring packet of isochronous transfer type in USB 3.0.

Please refer to FIG. 3. FIG. 3 is a flowchart illustrating a method 300 for increasing the efficiency of transferring packet of isochronous transfer type in USB 3.0. For the method 300, it is assumed that the transmitting end T is about to transmit two packets $DP_1$ and $DP_2$ of isochronous transfer type, and the transferring sequence for the packets is that the transmitting end T transmits the packet $DP_1$ to the receiving end R first, and then transmits the packet $DP_2$ to the receiving end R. The steps are described as follows:

Step 301: The receiving end R receives the packet $DP_1$ of isochronous transfer type transmitted from the transmitting end T;

Step 302: The receiving end R executes error code checking on the header $H_1$ of the packet $DP_1$ of isochronous transfer type according to the link command word error check code $CRC_{L1}$ and the header error check code $CRC_{H1}$ of the packet $DP_1$ of isochronous transfer type for obtaining a link command word check result $E_{L1}$ and a header check result $E_{H1}$ respectively;

Step 303: The receiving end R determines if the header $H_1$ of the packet $DP_1$ is correct according to the link command word check result $E_{L1}$ and the header check result $E_{H1}$; if so, go to step 304; if not, go to step 305;

Step 304: The receiving end R accepts the packet $DP_1$ of isochronous transfer type for executing the following process;

Step 305: The receiving end R ignores the packet $DP_1$ of isochronous transfer type and does not require the transmitting end T to transmit the packet $DP_1$ of isochronous transfer type again so as to allow the transmitting end T to transmit the next packet $DP_2$ of isochronous transfer type.

Additionally, the steps 301~305 above-mentioned can be executed in the data link layer DL of the receiving end R.

In the step 301, when the packet $DP_1$ is received from the transmitting end T, the packet $DP_1$ can be determined to be isochronous transfer type according to the type information $TP_1$ and the end point information $EP_1$ of the packet $DP_1$.

In the step 302, the error check code $CRC_{H1}$ of the header $H_1$ of the packet $DP_1$ may be Cyclic Redundancy Check 16 (CRC-16), and the error check code $CRC_{L1}$ may be CRC-5. The way to determine if the header $H_1$ of the packet $DP_1$ is correct can be executing CRC respectively on the header $H_1$ and the link command word $LW_1$ of the packet $DP_1$. For example, the overall CRC of the header $H_1$ is to divide the header $H_1$ (including the error check code $CRC_{H1}$) of the packet $DP_1$ by a predetermined divisor $CRC_{DH}$ for obtaining a corresponding remainder $CRC_{RH1}$. The header check result $E_{H1}$ is obtained according to the remainder $CRC_{RH1}$, and the link command word check result $E_{L1}$ can be obtained similarly.

In the step 303, when the remainder $CRC_{RH1}$ equals a predetermined value X, the header check result $E_{H1}$ represents the header $H_1$ of the packet $DP_1$ is correct; when the remainder $CRC_{RH1}$ does not equal the predetermined value X, the header check result $E_{H1}$ represents the header $H_1$ of the packet $DP_1$ is incorrect. For example, it is assumed that the predetermined value X is 0; when the remainder $CRCR_{H1}$ equals 0, the header check result $E_{H1}$ represents the header $H_1$ of the packet $DP_1$ is correct; when the remainder $CRCR_{H1}$ does not equal 0, the header check result $E_{H1}$ represents the header $H_1$ of the packet $DP_1$ is incorrect. The link command word check result $E_{L1}$ can be obtained similarly. In the present embodiment, when both the header check result $E_{H1}$ and the link command word check result $E_{L1}$ represent correct, the header $H_1$ is determined to be correct; when one of the header check result $E_{H1}$ and the link command word check result $E_{L1}$ represents incorrect, the header $H_1$ is determined to be incorrect.

In the step 304, after the receiving end R accepts the packet $DP_1$ of isochronous transfer type, the packet $DP_1$ is uploaded to the protocol layer PR for the following process and the following process in the protocol layer PR is similar to the description above and will not be repeated again for brevity.

In the step 305, the receiving end R is informed that the packet $DP_1$ is incorrect by the header check result $E_{H1}$ and the link command word check result $E_{L1}$, and accordingly ignores the packet $DP_1$. However, for increasing the transferring efficiency, which means the transmitting end T transmits the next packet $DP_2$ sooner, the receiving end R does not require the transmitting end T to transmit the packet $DP_1$ again, which means the data link layer DL of the receiving end R does not send the retry signal $S_{RETRY}$, requiring the transmitting end T to transmit the packet $DP_1$ again, to the transmitting end T. More particularly, if the transmitting end T is required to transmit the packet $DP_1$ again, the transmitting end T will transmit the packet $DP_1$ for the second time, which delays the moment that the next packet $DP_2$ is sent, and consequently the discontinuous condition or the un-synchronization arises. However, since in the step 305 of the present invention, the transmitting end T is not required to transmit the packet $DP_1$ again, the next packet $DP_2$ can be instantly transmitted to the receiving end R, instead of being delayed by the re-transmission for the packet $DP_1$, so as to increase the transferring efficiency and improve the discontinuous condition or the un-synchronization for the audio data or the video data.

Figure 4:
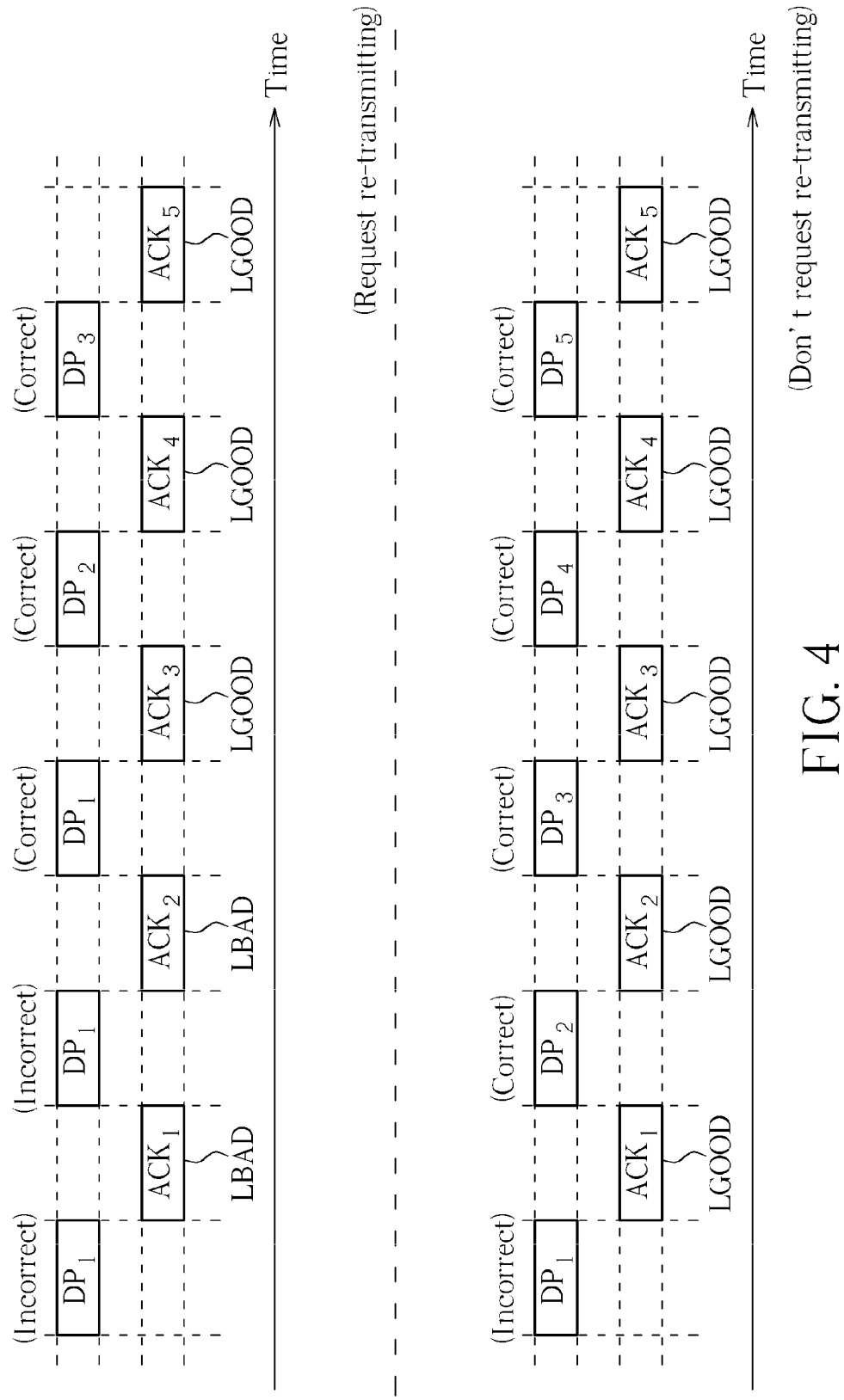
FIG. 4 is a diagram illustrating the transmitting end not being required to re-transmit a packet of isochronous transfer type when the header of the packet is incorrect according to the present invention.

Please refer to FIG. 4. FIG. 4 is a diagram illustrating the transmitting end T not being required to re-transmit a packet of isochronous transfer type (step 305) when the header of the packet is incorrect according to the present invention. The top half of FIG. 4 illustrates the transmitting end T being required to re-transmit a packet of isochronous transfer type when the header of the packet is incorrect (prior art); the bottom half of FIG. 4 illustrates the transmitting end T not being required to re-transmit a packet of isochronous transfer type (step 305) when the header of the packet is incorrect according to the present invention. By comparing the top half and the bottom half of FIG. 4, it is known that the method provided by the present invention can certainly increase the efficiency of transferring packets of isochronous transfer type. In FIG. 4, it is assumed that the transmitting end T is to transmit the packets $DP_1$, $DP_2$, $DP_3$, $DP_4$, and $DP_5$ of isochronous transfer type sequentially. When the receiving end R receives a packet, in the process of the data link layer, the header of the received packet is executed with error check and accordingly a corresponding acknowledge signal ACK is transmitted to the transmitting end T for informing the transmitting end T that the transmitted packet has been correctly received. For example, when the acknowledge signal ACK represents "LGOOD", it means the packet transmitted by the transmitting end T is correctly received so the transmitting end T does not have to re-transmit the packet; when the acknowledge signal ACK represents "LBAD", it means the packet transmitted by the transmitting end T is not correctly received and the transmitting end T has to re-transmit the packet. That is, when the acknowledge signal represents "LBAD", the receiving end R sends out a retry signal $S_{RETRY}$ for requiring the transmitting end T to re-transmit the packet. It can be seen from the bottom half of FIG. 4 that the packet $DP_1$ is determined to be incorrect by the process of the data link layer DL of the receiving end R. However, the acknowledge signal $ACK_1$ corresponding to the packet $DP_1$ still represents "LGOOD", so for the transmitting end T, it seems that the transmission of the packet $DP_1$ is successful and thus a next packet $DP_2$ is to be transmitted by the transmitting end T consecutively. Furthermore, the receiving end R is informed by the error check that the packet $DP_1$ is incorrect so that actually the receiving end R does not execute the following process for the packet $DP_1$. Instead, the packet $DP_1$ is ignored. On the other hand, from the top half of FIG. 4, it can be seen that the packet $DP_1$ is determined to be incorrect by the process of the data link layer DL of the receiving end R. Thus, the acknowledge signal $ACK_1$ corresponding to the packet $DP_1$ represents "LBAD" to inform the transmitting end T that a re-transmission of the packet $DP_1$ is required. After the transmitting end T transmits the packet DP, for the second time, the packet $DP_1$ from the transmission for the second time is still determined to be incorrect by the process of the data link layer DL of the receiving end R, and the acknowledge signal $ACK_2$ corresponding to the packet $DP_1$, from the transmission for the second time still represents "LBAD" to inform the transmitting end T that the re-transmission for the packet $DP_1$ is still required. The receiving end R receives a correct packet $DP_1$ till the transmitting end T transmits the packet $DP_1$ for the third time and accordingly responds an acknowledge signal $ACK_3$ to the transmitting end T so that the transmitting end T can transmit the next packet $DP_2$. From the description above, it is known that within the same time, five packets $DP_1$~$DP_3$ shown in the bottom half of FIG. 4 are completely transmitted, but only three packet $DP_1$~$DP_3$ are transmitted shown in the top half of FIG. 4. Although the packet $DP_1$, is received incorrectly by the receiving end R in the bottom half of FIG. 4, it is allowable for the audio or video transmissions and consequently the transmission efficiency is increased. The packets received are all correct in the top half of FIG. 4, however, the transmission efficiency is decreased because of the re-transmission, which possibly causes unsynchronization between the transmitting end T and the receiving end R, causing great inconvenience.

Furthermore, for the transmission under USB 3.0, the transmitting end T comprises a packet transmitting counter $C_T$ for counting the number $N_T$ of transmitted packets so as to write a correct value in the header sequence number HSEQ; the receiving end R comprises a packet receiving counter CR for counting the number $N_R$ of received packets so as to determine if the header sequence number of the received packet DP is correct. Before the initialization between the transmitting end T and the receiving end R, the transmitting end T synchronizes the number $N_T$ of the transmitted packets of the transmitting end T and the number $N_R$ of the received packets of the receiving end R. More particularly, before the initialization between the transmitting end T and the receiving end R, the transmitting end T resets the number $N_T$ of the transmitted packets to be a predetermined value $N_1$ and sends out a synchronous sequence signal $S_{SEQ}$ to the receiving end R so as to reset the number $N_R$ of the received packets of the receiving end R to be the predetermined value $N_1$. Meanwhile, the receiving end R is informed that each time the receiving end R receives a packet correctly, the number $N_R$ of the received packets is increased with a step number $N_{STEP}$. In this way, every time when the transmitting end T receives an acknowledge signal ACK representing "LGOOD" (meaning the receiving end R has correctly received the packet), the number $N_T$ of the transmitted packets is increased with the step number $N_{STEP}$ as well. For example, when the transmitting end T is to transmit a first packet $DP_0$, the transmitting end T sets the header sequence number $HSEQ_0$ to be $N_1$ according to the value of the number $N_T$ of the transmitted packets. When the receiving end R receives the packet $DP_0$, the receiving end R compares the value ($N_1$) of the header sequence number $H_{SEQ0}$ with the value ($N_1$) of the number $N_R$ of the received packets. If the value of the header sequence number $HSEQ_0$ equals the value of the number $N_R$ of the received packets ($N_1$), the receiving end R determines the packet sequence of the packet $DP_0$ to be correct; if not, the receiving end R determines the packet sequence of the packet $DP_0$ to be incorrect. After the receiving end R correctly receives the packet $DP_0$, the receiving end R increases the number $N_R$ of the received packets with the step number $N_{STEP}$, which means the value of the number $N_R$ of the received packets becomes ($N_1+N_{STEP}$), and then the receiving end R sends out an acknowledge signal ACK representing "LGOOD" to the transmitting end T for the transmitting end T increasing the value of the number $N_T$ of the transmitted packets with the step number $N_{STEP}$. In this way, when the transmitting end T is to transmit the following packet $DP_1$, of the packet $DP_0$, the transmitting end T sets the header sequence number $HSEQ_1$ of the packet $DP_1$ to be ($N_1+N_{STEP}$) according to the value of the number NT of the transmitted packets. Thus, when the receiving end R receives the packet $DP_1$, the receiving end R compares the value of the number $N_R$ of the received packets with the value of the header sequence number $HSEQ_1$ for determining if the packet sequence of the packet $DP_1$, is correct.

Figure 5:
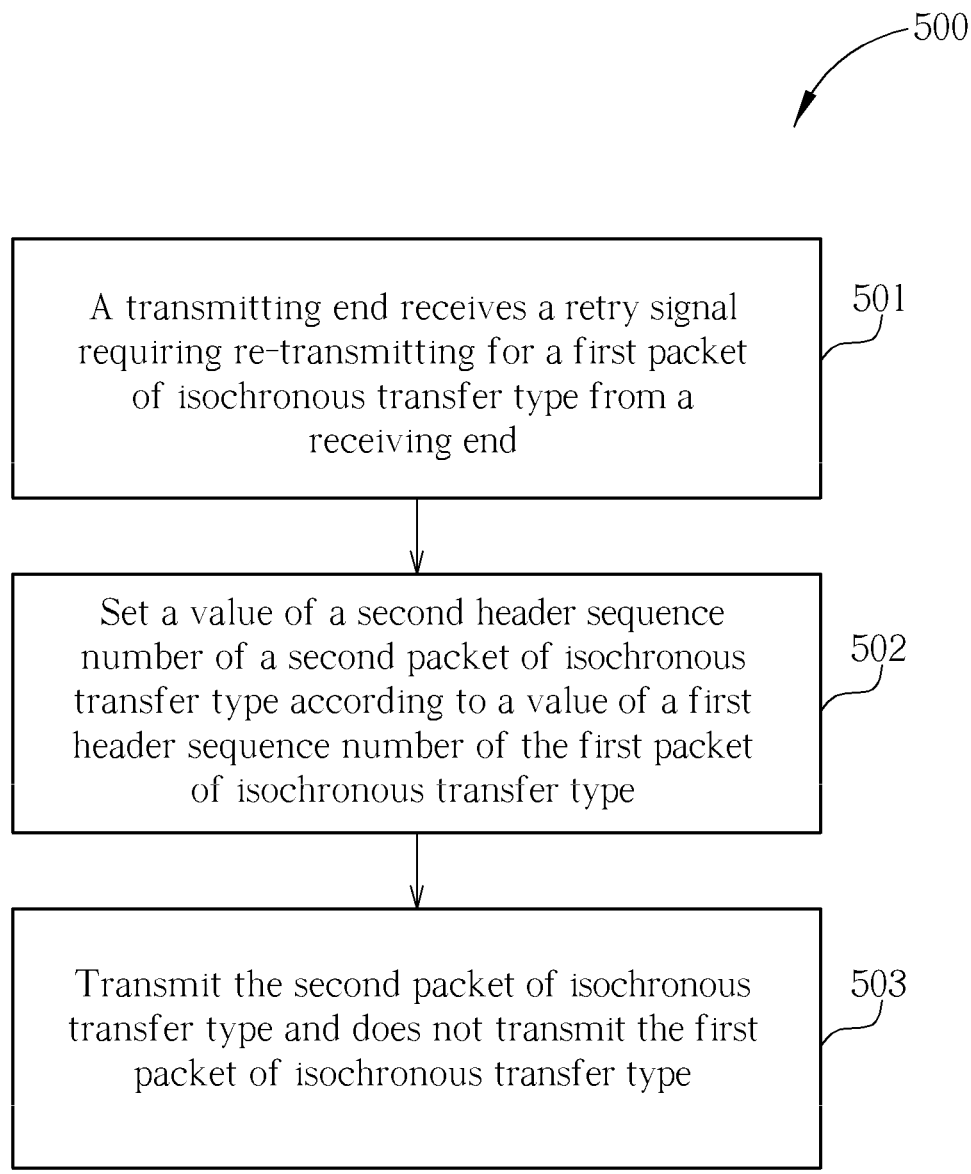
FIG. 5 is a flowchart illustrating a method for increasing efficiency of transferring packet of isochronous transfer type in USB 3.0 according to a second embodiment of the present invention.

Please refer to FIG. 5. FIG. 5 is a flowchart illustrating a method for increasing efficiency of transferring packet of isochronous transfer type in USB 3.0 according to a second embodiment of the present invention. In the method 500, it is assumed that the transmitting end T is to transmit two packets $DP_0$ and $DP_1$ of isochronous transfer type. That is, the buffer of the transmitting end T stores the packets $DP_0$ and $DP_1$ waiting to be transmitted, and the sequence for transmission of the packets $DP_0$ and $DP_1$, is that the packet $DP_0$ is transmitted to the receiving end R first, and then the packet $DP_1$ is transmitted to the receiving end R. In the present embodiment, when the receiving end R receives the packet $DP_0$, the receiving end R determines if the link command word $LW_0$ or the header $H_0$ of the received packet $DP_0$ is incorrect according to the link command word error check code $CRC_{L0}$ and the header error check code $CRC_{H0}$ of the packet $DP_0$ of isochronous transfer type, and accordingly sends out a retry signal $S_{RETRY}$ to the transmitting end T for requiring re-transmission for the packet $DP_0$ of isochronous transfer type. The steps are explained as follows:

Step 501: The transmitting end T receives a retry signal $S_{RETRY}$ requiring re-transmission for the packet $DP_0$ of isochronous transfer type from the receiving end R;

Step 502: The transmitting end T sets the value of the header sequence number $HSEQ_1$ of the packet $DP_1$ of isochronous transfer type according to the value of the header sequence number $HSEQ_0$ of the packet $DP_0$;

Step 503: The transmitting end T transmits the packet $DP_1$ of isochronous transfer type and does not transmit the packet $DP_0$.

Additionally, the steps 501~503 are executed in the data link layer DL of the transmitting end T.

In the step 501, the transmitting end T can be informed by the retry signal $S_{RETRY}$ that the receiving end R does not successfully receive the packet (the packet $DP_0$) previously transmitted by the transmitting end T, and the transmitting end T can be informed by the type information $TP_0$ and the end point information $EP_0$ of the packet $DP_0$ stored in the buffer of the transmitting end T that the packet $DP_0$ is of isochronous transfer type.

In the step 502, since the transmitting end T does not receive the acknowledge signal ACK representing "LGOOD", the number $N_T$ of the transmitted packets of the transmitting end T is not increased with the step number $N_{STEP}$. More particularly, the value of the number $N_T$ of the transmitted packets of the transmitting end T equals the value of the header sequence number $HSEQ_0$ of the packet $DP_0$. Thus, the transmitting end T sets the value of the header sequence number $HSEQ_1$ of the packet $DP_1$ according to the value of the number $N_T$ of the transmitted packets (equals the value of the header sequence number $HSEQ_0$). For example, if the value of the header sequence number $HSEQ_0$ is 0, then the transmitting end T sets the value of the header sequence number $HSEQ_1$ of the packet $DP_1$ to be 0.

In the step 503, the transmitting end T directly transmits the packet $DP_1$. Since the value of the header sequence number $HSEQ_1$ is set to be equal to the value of the header sequence number $HSEQ_0$ of the packet $DP_0$, the value of the number $N_R$ of the received packets of the receiving end R still remains to be equal to the value of the header sequence number $HSEQ_0$. Therefore, when the receiving end R receives the packet $DP_1$, because the value of the header sequence number $HSEQ_1$ of the packet $DP_1$ equals the value of the header sequence number $HSEQ_0$, which means the value of the header sequence number $HSEQ_1$ equals the value of the number $N_R$ of the received packets), the receiving end R determines the packet sequence of the packet $DP_1$ to be correct.

Figure 6:
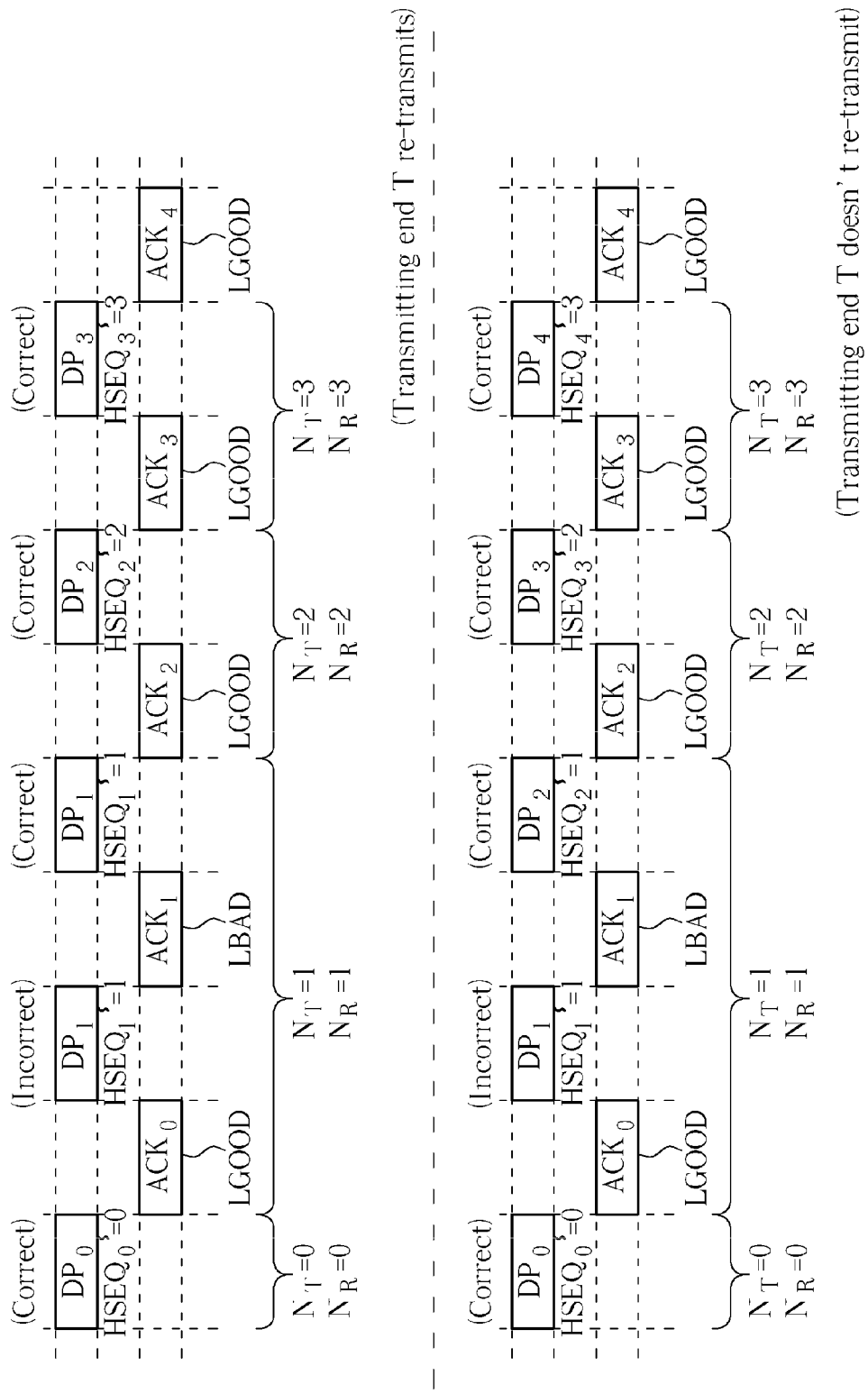
FIG. 6 is a diagram illustrating the transmitting end not re-transmitting the packet previously transmitted under the condition that the receiving end requires the transmitting end to re-transmit the packet of isochronous transfer type previously transmitted by the transmitting end.

Please refer to FIG. 6. FIG. 6 is a diagram illustrating the transmitting end T not re-transmitting the packet previously transmitted (step 503) under the condition that the receiving end R requires the transmitting end T to re-transmit the packet of isochronous transfer type previously transmitted by the transmitting end T. In FIG. 6, it is assumed that the transmitting end T has sent the sequence signal $S_{SEQ}$ to the receiving end R. The transmitting end T resets the number $N_T$ of the transmitted packets to be the predetermined value $N_1$ (in FIG. 6, the predetermined value is 0). The receiving end R resets the number $N_R$ of the received packets to be the predetermined value $N_1$ (0) as well. Additionally, the step number $N_{STEP}$ is set to be 1. The top half of FIG. 6 illustrates the transmitting end T re-transmitting the packet previously transmitted under the condition that the receiving end R requires the transmitting end T to re-transmit the packet of isochronous transfer type previously transmitted by the transmitting end T (prior art); the bottom half of FIG. 6 illustrates the transmitting end T not re-transmitting the packet previously transmitted (step 503 according to the present invention) under the condition that the receiving end R requires the transmitting end T to re-transmit the packet of isochronous transfer type previously transmitted by the transmitting end T.

By such manner, it can be understood that the present invention can certainly increase the efficiency of transferring packet of isochronous transfer type in USB 3.0. In FIG. 6, it is assumed that the transmitting end T is to transmit the packets $DP_0$, $DP_1$, $DP_2$, $DP_3$, and $DP_4$ sequentially, and the packet $DP_1$ is determined to be incorrect during the process of the data link layer DL of the receiving end R. Thus, the number $N_R$ of the received packets of the receiving end R still remains to be 1, and the receiving end R sends out an acknowledge signal $ACK_1$ (corresponding to the packet $DP_1$) representing "LBAD" for requiring the transmitting end T to re-transmit. Consequently, the number $N_T$ of the transmitted packets of the transmitting end T still remains to be 1 as well. In the top half of FIG. 6, the transmitting end T re-transmits the packet $DP_1$; however, in the bottom half of FIG. 6, the transmitting end T does not re-transmit the packet $DP_1$. Instead, the transmitting end T sets the value of the header sequence number $HSEQ_2$ of the packet $DP_2$ according to the current value of the number $N_T$ of the transmitted packets (equals to the value of the header sequence number $HSEQ_1$) and transmits the packet $DP_2$ to the receiving end R. In this way, when the receiving end R receives the packet $DP_2$ with the value of the header sequence number $HSEQ_2$ changed to be 1, the receiving end R determines the packet sequence of the packet $DP_2$ to be correct according to the value of the number $N_R$ of the received packets (equals 1) and the value of the value of the header sequence number $HSEQ_2$ (equals 1). If the value of the header sequence number $HSEQ_2$ of the packet $DP_2$ is not set to be 1, the receiving end R determines that during the transmission a packet with the value of the header sequence number equaling 1 is lost, according to the value of the number $N_R$ of the received packets (equals 1) and the value of the header sequence number $HSEQ_2$ (does not equals 1). Meanwhile, the receiving end R determines un-synchronous to the transmitting end T and consequently sends out a synchronous request signal $S_{SYN}$ to the transmitting end T for requesting synchronization. In the bottom half of FIG. 6, after the transmitting end T completes the transmission of the packet $DP_2$, the receiving end R correctly receives the packet $DP_2$, and increases the value of the number $N_R$ of the received packets (equals 1) with the step number $N_{STEP}$ so that the value of the number $N_R$ of the received packets becomes 2. The receiving end R sends out an acknowledge signal $ACK_2$ (corresponding to the packet $DP_2$) representing "LGOOD". Consequently, the transmitting end T increases the value of the number $N_T$ of the transmitted packets with the step number $N_{STEP}$ so that the value of the number $N_T$ of the transmitted packets becomes 2. In this way, when the transmitting end T is to transmit the packet $DP_3$, because the value of the number $N_T$ of the transmitted packets equals the value of the number $N_R$ of the received packets, the transmitting end T sets the header sequence number $HSEQ_3$ with the correct value, which allows the receiving end R to determine the packet sequence to be correct and not to send out the synchronous request signal $S_{SYN}$. In this way, within the same time, five packets $DP_0$~$DP_4$ are completely transmitted as shown in the bottom half of FIG. 6, while only four packets $DP_0$~$DP_3$ are transmitted as shown in the top half of FIG. 6. Although in the bottom half of FIG. 6, the packet $DP_1$ received is incorrect, and the transmitting end T does not re-transmit the packet $DP_1$, such condition is allowable when the audio or the video transmissions is executed and the transmission efficiency is increased. The packets received are all correct in the top half of FIG. 6, however, the transmission efficiency is decreased because of the re-transmission, which possibly causes un-synchronization between the transmitting end T and the receiving end R, causing great inconvenience.

Figure 7:
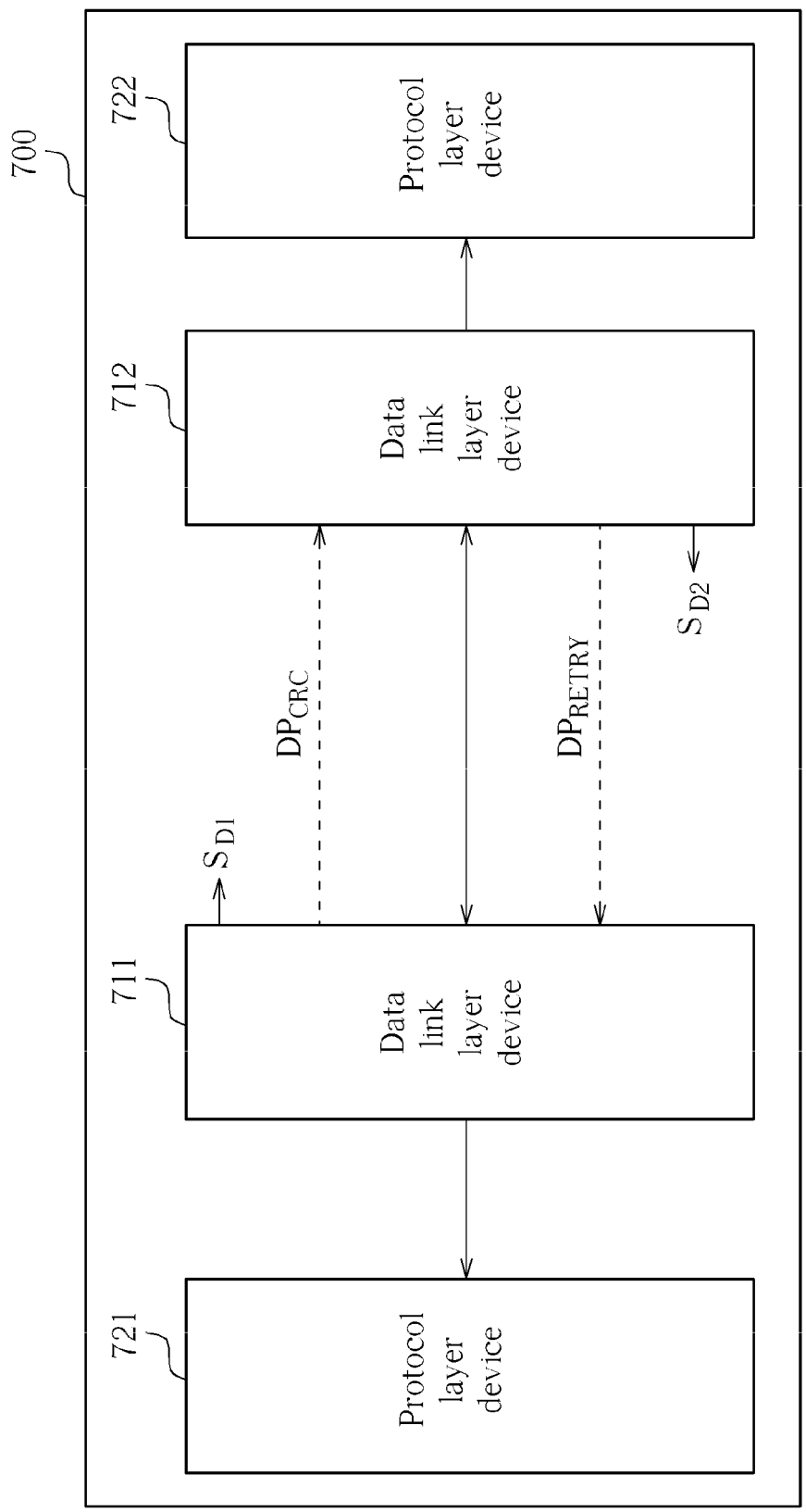
FIG. 7 is a diagram illustrating an apparatus for sending data on an isochronous communication protocol according to the present invention.

Please refer to FIG. 7. FIG. 7 is a diagram illustrating an apparatus 700 for sending data on an isochronous communication protocol according to the present invention. The apparatus 700 is utilized to transmit data. The apparatus 700 comprises a first data link layer device 711, a second data link layer device 712, a first protocol layer device 721, and a second protocol layer device 722. Additionally, the apparatus 700 comprises physical layer devices corresponding to the first and the second data link layer device 711 and 712 (not shown). The apparatus 700 is derived from the first and the second embodiments of the present invention. As shown in FIG. 7, when the first data link layer device 711 and the first protocol layer device 721 are in the transmitting end, the second data link layer device 712 and the second protocol layer device 722 are in the receiving end; when the first data link layer device 711 and the first protocol layer device 721 are in the receiving end, the second data link layer device 712 and the second protocol layer device 722 are in the transmitting end. The first data link layer device 711 and the second data link layer device 712 are both capable of detecting the data transmitted between the two data link layer device 711 and 712 and accordingly generating detecting signals $S_{D1}$ and $S_{D2}$. For example, it is assumed that the first data link layer device 711 and the first protocol layer device 721 are in the receiving end, and the second data link layer device 712 and the second protocol layer device 722 are in the transmitting end; when the first data link layer device 711 detects a CRC error in the transmitted packet, the detecting signal $S_{D1}$ indicates the CRC error and the first data link layer device 711 accordingly transmits a cheating packet data $DP_{CRC}$ to the second data link layer device 712, wherein the cheating packet data $DP_{CRC}$ comprises the erroneous packet data corresponding to the CRC error. The second data link layer device 712 processes the received cheating packet data $DP_{CRC}$ and then transmits to the second protocol layer device 722. When the first data link layer device 711 detects a retry signal transmitted from the second data link layer device 712, the detecting signal $S_{D2}$ represents that re-transmitting a first packet is required, and the second data link layer device 712 accordingly transmits a cheating packet data $DP_{RETRY}$ to the first data link layer device 711, wherein the cheating packet data $DP_{RETRY}$ comprises a second packet data which is different from the first packet. The first data link layer device 711 processes the received cheating packet data $DP_{RETRY}$ and then transmits to the first protocol layer device 721. Besides, the second packet may be a packet following the first packet.

To sum up, in the present invention for transmitting packets, the receiving end does not send out the retry signal to the transmitting end when a packet of isochronous transfer type with errors exists in the data link layer. Furthermore, the present invention provides another method for transmitting, which allows the transmitting end to directly transmit the current packet of isochronous transfer type instead of transmitting the previous packet of isochronous transfer type when the transmitting end receives a retry signal representing that the re-transmission of the previous packet of isochronous transfer type is required, so as for the transmitting end transmitting the successive packets of isochronous transfer type more quickly. In this way, the problem of discontinuous condition or the un-synchronization for isochronous transfer type can be solved, which provides great convenience.

Those skilled in the art will readily observe that numerous modifications and alterations of the device and method may be made while retaining the teachings of the invention.

What is claimed is:

1. A method for increasing efficiency of transferring packet of isochronous transfer type, the method comprising:

receiving a first packet of isochronous transfer type from a transmitting end;
executing error code check on a header of the first packet of isochronous transfer type for obtaining a check result; and
ignoring the first packet of isochronous transfer type when the check result represents incorrect;
wherein the step of executing error code check on the header of the first packet of isochronous transfer type for obtaining the check result comprises:
  executing Cyclic Redundancy Check (CRC) on a header error check code of the header of the first packet of isochronous transfer type for obtaining a header check result;
  executing CRC on a link command word error check code of the header of the first packet of isochronous transfer type for obtaining a link command word check result; and
  obtaining the check result according to the header check result and the link command word check result.

2. The method of claim 1, further comprising:
receiving the first packet of isochronous transfer type for executing following process when the check result represents correct.

3. The method of claim 1, wherein the transmitting end may be a host or a device.

4. The method of claim 1, wherein obtaining the check result according to the header check result and the link command word check result comprises:
when the header check result represents correct and the link command word check result represents correct, the check result represents correct; and
when one of the header check result and the link command word check result represents incorrect, the check result represents incorrect.

5. The method of claim 1, wherein ignoring the first packet of isochronous transfer type when the check result represents incorrect comprises:
not requiring the transmitting end to re-transmit the first packet of isochronous transfer type when the check result represents incorrect.

6. The method of claim 5, wherein not requiring the transmitting end to re-transmit the first packet of isochronous transfer type when the check result represents incorrect comprises:
not requiring the transmitting end to re-transmit the first packet of isochronous transfer type for the transmitting end transmitting a second packet of isochronous transfer type directly.

7. The method of claim 1, wherein the header error check code is CRC-16; the link command word error check code is CRC-5.

8. The method of claim 7, wherein executing CRC on the header error check code of the header of the first packet of isochronous transfer type for obtaining the header check result comprises:
dividing the header error check code of the header of the first packet of isochronous transfer type by a predetermined divisor for obtaining a remainder; and
obtaining the header check result according to the remainder.

9. The method of claim 8, wherein when the remainder equals a predetermined value, the header check result represents correct; when the remainder does not equal the predetermined value, the header check result represents incorrect.

10. The method of claim 9, wherein the predetermined value may be zero.

11. The method of claim 7, wherein executing CRC on the link command word error check code of the header of the first packet of isochronous transfer type for obtaining the header check result comprises:
dividing the link command word check code of the header of the first packet of isochronous transfer type by a predetermined divisor for obtaining a remainder; and
obtaining the link command word check result according to the remainder.

12. The method of claim 11, wherein when the remainder equals a predetermined value, the link command word check result represents correct; when the remainder does not equal the predetermined value, the link command word check result represents incorrect.

13. The method of claim 12, wherein the predetermined value may be zero.

14. A method for increasing efficiency of transferring packet of isochronous transfer type, the method comprising:
when a transmitting end receives a retry signal corresponding to a first packet of isochronous transfer type from a receiving end, the transmitting end setting value of a second header sequence number of a second packet of isochronous transfer type according to value of a first header sequence number of the first packet of isochronous transfer type; and
the transmitting end transmitting the second packet of isochronous transfer type with set second header sequence number to the receiving end.

15. The method of claim 14, further comprising:
the transmitting end determining if the first packet is of isochronous transfer type according to a type information and an end point information of the first packet.

16. The method of claim 14, wherein when the transmitting end is a host, the receiving end is a device; when the transmitting end is a device, the receiving end is a host.

17. The method of claim 14, wherein the transmitting end first transmits the first packet of isochronous transfer type and then transmits the second packet of isochronous transfer type.

18. The method of claim 17, wherein the transmitting end setting value of the second header sequence number of the second packet of isochronous transfer type according to value of the first header sequence number of the first packet of isochronous transfer type comprises:
the transmitting end setting the value of the second header sequence number of the second packet of isochronous transfer type to be the value of the first header sequence number of the first packet of isochronous transfer type.

19. The method of claim 18, further comprising:
the transmitting end synchronizing the transmitting end and the receiving end before the transmitting end transmits the first packet of isochronous transfer type.

20. The method of claim 19, wherein the transmitting end synchronizing the transmitting end and the receiving end comprises:
the transmitting end resetting value of a transmitted packet counter of the transmitting end to be a predetermined value; and
the transmitting end transmitting a synchronous sequence signal to the receiving end for resetting value of a received packet counter of the receiving end to be the predetermined value.

21. The method of claim 20, further comprising:
the transmitting end controlling the transmitted packet counter to increase a step number every time after a packet is transmitted; and
the transmitting end informing the receiving end for controlling the received packet counter to increase the step number every time after a packet is correctly received.

22. The method of claim 21, further comprising:
when the transmitting end receives the retry signal from the receiving end, the transmitting end controlling the transmitted packet counter not to increase the step number.

23. The method of claim 22, wherein the first header sequence number of the first packet of isochronous transfer type is the value of the transmitted packet counter.

24. An apparatus for sending data on an isochronous communication protocol, the apparatus comprising:
a first data link layer device for detecting a CRC error in a transmitted packet and sending a first cheating packet data to a second data link layer device when the CRC error is detected, wherein the first cheating packet data comprises an error packet data corresponding to the CRC error; and
the second data link layer device for processing the received first cheating packet data and sending the processed first cheating packet data.

25. The apparatus of claim 24, further comprising a protocol layer device for receiving the processed first cheating packet data.

26. The apparatus of claim 24, wherein the second data link layer device is further used for sending the first data link layer device a retry signal indicating re-transmission of a first packet data, and sending the first data link layer device a second cheating packet data which comprises a second packet data different from the first packet data when the first data link layer device detects the retry signal and the first data link device is further used for processing the received second cheating packet data and sending the processed second cheating data.

27. The apparatus of claim 26, further comprising a physical layer device for receiving the processed second cheating packet data.

* * * * *